United States Patent
Haskell et al.

(10) Patent No.: US 6,429,132 B1
(45) Date of Patent: Aug. 6, 2002

(54) COMBINATION CMP-ETCH METHOD FOR FORMING A THIN PLANAR LAYER OVER THE SURFACE OF A DEVICE

(75) Inventors: Jacob Daniel Haskell, Palo Alto; Rong Hsu, Cupertino, both of CA (US)

(73) Assignee: Aurora Systems, Inc., San Jose, CA (US)

( * ) Notice: Subject to any disclaimer, the term of this patent is extended or adjusted under 35 U.S.C. 154(b) by 0 days.

(21) Appl. No.: 09/220,814

(22) Filed: Dec. 23, 1998

(51) Int. Cl.[7] .............................................. H01L 21/302
(52) U.S. Cl. ........................ 438/692; 438/690; 438/691; 438/693; 438/706; 438/710; 438/724; 438/745; 438/757
(58) Field of Search ................................ 438/690, 691, 438/692, 693, 706, 710, 724, 745, 757

(56) References Cited

U.S. PATENT DOCUMENTS 5,500,558 A * 3/1996 Hayashide .................. 257/758
5,804,084 A * 9/1998 Nasby et al. ................... 216/2
5,978,056 A * 11/1999 Shintani et al. ............. 349/137
6,048,800 A * 4/2000 Nasgashima et al. ....... 438/761

\* cited by examiner

Primary Examiner—Benjamin L. Utech
Assistant Examiner—Charlotte A. Brown
(74) Attorney, Agent, or Firm—Henneman & Saunders; Larry E. Henneman, Jr.

(57) ABSTRACT

A combination CMP-etch method for forming a thin planar layer over the surface of a device includes the steps of providing a substrate including a plurality of surface projections defining gaps therebetween, forming an etchable layer on the substrate, performing a CMP process on the etchable layer to form a planar layer having a first thickness in excess of 1,000 Angstroms, and etching the planar layer to a second thickness less than 1,000 Angstroms. In a particular method, the step of forming the etchable layer includes the steps of forming an etch resistant layer on the substrate, forming a fill layer on the etch-resistant layer, etching the fill layer to expose portions of the etch-resistant layer overlying the projections, and to leave a portion of the fill layer in the gaps, and forming the etchable layer on the exposed portions of the etch-resistant layer and the fill layer.

35 Claims, 6 Drawing Sheets

COMBINATION CMP-ETCH METHOD FOR FORMING A THIN PLANAR LAYER OVER THE SURFACE OF A DEVICE

BACKGROUND OF THE INVENTION

1. Field of the Invention

This invention relates generally to a method for planarizing wafer-based integrated circuits, and more particularly to a novel method for planarizing the surface of an integrated circuit having optical elements disposed thereon. Even more particularly, the invention relates to a novel method for planarizing the reflective surface of a wafer-based, reflective light-valve backplane.

2. Description of the Background Art

Wafer-based reflective light-valves have many advantages over their transmissive predecessors. For example, conventional transmissive displays are based on thin-film transistor (TFT) technology, whereby the displays are formed on a glass substrate, with the TFTs disposed in the spaces between the pixel apertures. Placing the driving circuitry between the pixel apertures limits the area of the display available for light transmission, and therefore limits the brightness of transmissive displays. In contrast, the driving circuitry of reflective displays is located under reflective pixel mirrors, and does not, therefore, consume valuable surface area of the display. As a result, reflective displays are more than twice as bright as their transmissive counterparts.

Another advantage of wafer-based reflective displays is that they can be manufactured with standard CMOS processes, and can therefore benefit from modem submicron CMOS technology. In particular, the reduced spacing between pixel mirrors increases the brightness of the display, and reduces the pixelated appearance of displayed images. Additionally, the CMOS circuitry switches at speeds one or more orders of magnitude faster than comparable TFT circuitry, making wafer-based reflective displays well suited for high speed video applications such as projectors and camcorder view finders.

FIG. 1 is a cross-sectional view of a prior art reflective display backplane 100, which is formed on a silicon substrate 102, and includes a layer 104 of integrated circuitry, an insulating support layer 106, a plurality of pixel mirrors 108, and a protective oxide layer 110. Each of pixel mirrors 108 is connected, through an associated via 112, to the circuitry of layer 104. Backplane 100 is typically incorporated into a reflective light valve (e.g., a liquid crystal display) by forming a layer 114 of an optically active medium (e.g., liquid crystal) over the pixel mirrors, and forming a transparent electrode (not shown) over the optically active medium. Light passing through the medium is modulated (e.g., polarization rotated), depending on the electrical signals applied to pixel mirrors 108.

One problem associated with prior reflective displays is that the generated images often appear mottled. One source of mottling in reflective displays is the non-uniform alignment of the liquid crystals in layer 114. The formation of liquid crystal layer 114 typically includes a wiping or rubbing step, wherein a roller or similar object is passed over the liquid crystal layer, resulting in alignment of the liquid crystals. However, pixel mirrors 108 project upward from the surface of backplane 100, defining gaps between adjacent pixel mirrors. Known wiping processes are ineffective to align the liquid crystals (represented by arrows in layer 114) in these gaps. Additionally, the misaligned crystals adversely affect the alignment of neighboring crystals in layer 114.

What is needed is a reflective backplane with a planar surface to facilitate the effective alignment of the entire liquid crystal layer.

FIG. 2 is a cross sectional view of a reflective backplane 200, illustrating the ineffectiveness of a method of planarizing the surface of reflective backplane 200 by depositing a thick protective oxide layer 202 and then etching layer 202 back to a desired thickness level 204. In particular, as oxide layer 202 is deposited, the opening 206 to the gap between pixel mirrors 108 closes before the gap is filled. This is known to those skilled in the art as the "keyhole effect." Then when oxide layer 202 is etched back to level 204, a nonplanar defect 208 remains over the partially filled gap, and will frustrate the uniform alignment of layer 114.

FIG. 3 is a cross sectional view of a reflective display backplane 300 illustrating an anticipated problem of using a prior art planarization process on a reflective backplane. Backplane 300 is planarized by forming a thick oxide layer 302 over pixel mirrors 108 and the portion of support layer 106 exposed by the gaps between pixel mirrors 108. Thick oxide layer 302 can only be formed without the keyhole effect shown in FIG. 2, if pixel mirrors 108 are sufficiently thin (e.g., less than 1000 angstroms). After its application, thick oxide layer 302 is ground down to a planar level 304, by a prior art process known as chemical-mechanical polishing (CMP). This process, also referred to as chemical-mechanical planarization, and is well known to those skilled in the art.

This method of planarizing the surface of reflective backplane 300 suffers from the disadvantage that it is limited to layers having a thickness of greater than or equal to 1,000 angstroms. That is, the CMP process is incapable of leaving an oxide layer of less than 1,000 angstroms over pixel mirrors 108. This planarization method is, therefore, not well suited for planarizing substrates having optical elements disposed on their surface, because the thickness of the film remaining on the optical element is often critical to its proper optical functionality.

What is needed is a method for planarizing the surface of substrates having optical elements disposed on their surface, that is capable of leaving layers over the optical elements, having a thickness of less than 1,000 angstroms.

SUMMARY

The present invention overcomes the limitations of the prior art by providing a novel method for planarizing a substrate (e.g., a reflective display backplane) including a plurality of surface projections (e.g., pixel mirrors) and thin surface films (e.g., optical thin film coatings). Where the substrate is a reflective display backplane, the resulting planar surface reduces mottling in projected images.

A disclosed method includes the steps of forming an etchable layer on the substrate, performing a CMP process on the etchable layer to form a planar layer having a first thickness (e.g., >1,000 Angstroms), and etching the planar layer to a second thickness (e.g., <1,000 Angstroms). In a particular method, the substrate is an integrated circuit and the projections are optical elements. In a more particular method, the substrate is a reflective display backplane, and the projections are pixel mirrors.

In a particular method suitable for planarizing substrates having surface projections in excess of 1,200 Angstroms, the step of forming the etchable layer includes the steps of forming an etch-resistant layer on the substrate, forming a fill layer on the etch-resistant layer, etching the fill layer to expose portions of the etch resistant layer overlying the projections and to leave a portion of the fill layer in the gaps, and forming the etchable layer on the exposed portions of the etch-resistant layer and the fill layer.

The etch resistant layer may include an optical thin film layer, and may be formed as a single layer. Optionally, the etch resistant layer includes a plurality of sublayers, for example an optical thin film layer and an etch resistant cap layer. In a particular method, the step of forming the etch resistant layer includes a step of forming an oxide layer and a second step of forming a nitride layer on the oxide layer.

The step of forming a fill layer on the etch resistant layer may include the step of applying a spin-on coating (e.g., spin-on glass) over the etch resistant layer. Optionally, the fill layer includes a suitable dopant to absorb light of a particular wave length.

One particular method of the present invention further includes an optional step of forming a protective layer over the planar layer. The protective layer may include a single layer or multiple layers. For example, in one more particular method, the step of forming the protective layer includes forming a nitride layer over the planar layer. Another more particular embodiment, further includes a step of forming an oxide layer over the nitride layer, and then forming a second nitride layer over the oxide layer.

BRIEF DESCRIPTION OF THE DRAWINGS

The present invention is described with reference to the following drawings, wherein like reference numbers denote substantially similar elements.

DETAILED DESCRIPTION

This patent application is related to the following co-pending patent applications, filed on even date herewith and assigned to a common assignee, each of which is incorporated herein by reference in its entirety:

Method For Manufacturing A Planar Reflective Light Valve Backplane, Ser. No. 09/219,579, U.S. Pat. No. 6,277,748; and A Planar Reflective Light Valve Backplane, Ser. No. 09/219,617, U.S. Pat. No. 6,252,999.

The present invention overcomes the problems associated with the prior art, by providing a method of planarizing a substrate having a plurality of surface projections. Specifically, the present invention describes a method for planarizing a substrate having thin film layers deposited thereon. In the following description, numerous specific details are set forth (e.g., specific compositions and thicknesses of optical, etch resistant, and protective layers) in order to provide a thorough understanding of the invention. Those skilled in the art will recognize, however, that the invention may be practiced apart from these specific details. In other instances, well known details of semiconductor processing and optical thin film coatings have been omitted, so as not to unnecessarily obscure the present invention.

Figure 4:
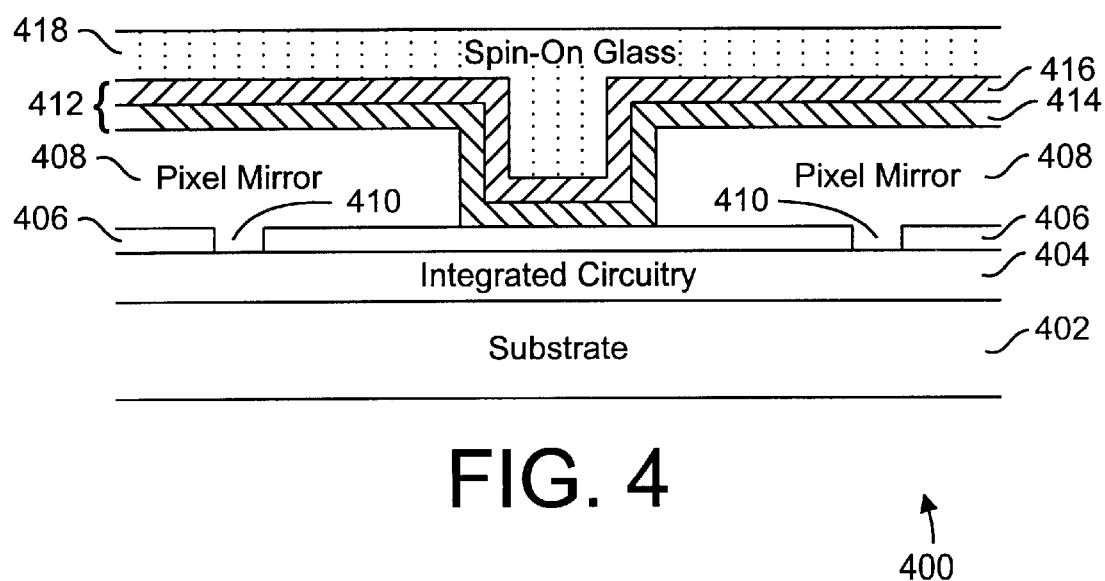
FIG. 4 is a cross-sectional view of a reflective light-valve backplane having an etch resistant layer and a fill layer deposited thereon.

FIG. 4 is a cross sectional view of a reflective backplane 400 during the first steps of a novel planarization process according to the present invention. Reflective backplane 400 is formed on a silicon substrate 402 which includes a layer 404 of integrated circuitry, an insulating support layer 406, and a plurality of pixel mirrors 408. Integrated circuitry layer 404 receives display data from a data source (not shown) and controls the assertion of the display data on pixel mirrors 408. Insulating support layer 406 provides support for pixel mirrors 408 and insulates pixel mirrors 408 from integrated circuitry layer 404. Each pixel mirror 408 is coupled to integrated circuitry layer 404 by an associated via 410 through support layer 406.

During the first step of the planarization process an etch resistant layer 412 is formed over pixel mirrors 408 and over portions of insulating support layer 406 exposed by the gaps between pixel mirrors 408. Etch resistant layer 412 includes an optical thin film layer 414 and an etch resistant cap layer 416. Optical thin film layer 414 optimizes the reflective performance of pixel mirrors 408 via thin film interference. Using means well known to those skilled in the optical arts, the thicknesses of such films are engineered to reinforce the refection of desirable to wavelengths of light through constructive interference, and to inhibit unwanted reflections through destructive interference. The thickness of a thin film optical coating is, therefore, critical to its functionality.

Etch resistant cap layer 416 protects optical thin film layer 414 from subsequent processing etches, insuring that its thickness remains unchanged. Additionally, etch-resistant cap layer 416 also functions as an optical thin film layer. Those skilled in the art will understand, therefore, that etch-resistant layer 412 including optical thin film layer 414 may also be properly understood to be an optical thin film coating 412 including etch resistant cap layer 416.

In a particular embodiment optical thin film layer 414 is formed by depositing silicon oxide to a thickness of 680 Å. Etch resistant cap layer 416 is formed by depositing silicon nitride to a thickness of 820 Å. Those skilled in the art will recognize, however, that optical thin film coatings of varying compositions and thicknesses may be substituted for optical thin film layer 414. Similarly, etch resistant cap layers of varying thicknesses and compositions may be substituted for etch resistant cap layer 416. In an alternate embodiment, etch resistant layer 412 is formed as a single layer of a material (e.g., nitride) which is both etch resistant and functional as an optical thin film.

During the next step in the planarization process, a fill layer 418 is deposited over etch resistant layer 412. In a particular embodiment, fill layer 418 is formed with a spin-on glass material available from Dow Coming as product C2052154D SOG FOX-15, using methods well known to those skilled in the art of silicon processing.

Figure 5:
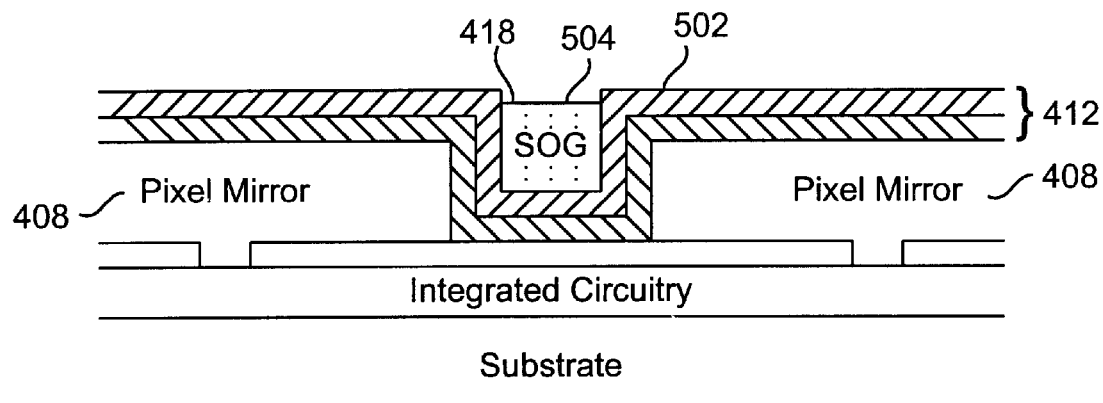
FIG. 5 is a cross-sectional view of the reflective light-valve backplane of FIG. 4, after a selective etch of the deposited fill layer.

FIG. 5 shows a cross sectional view of reflective backplane 400 following an etching step wherein fill layer 418 is etched for a period of time sufficient to expose portions of etch resistant it layer 412 overlying pixel mirrors 408, but leaving portions of fill layer 418 in the gap between pixel mirrors 408. Either a wet chemical etch (e.g., hydrofluoric acid) or a dry etch (e.g., plasma etch) may used to perform the etch step, but the wet etch exhibits greater selectivity between etch resistant layer 412 and the fill layer 418.

Because etch resistant layer 412 is resistant to the etchant used to remove fill layer 418, over etching fill layer 418 will not effect the thickness of etch resistant layer 412, particularly optical thin film layer 414. Over etching fill layer 418 will, however, result in the removal of a portion of fill layer 418 from the gap between pixel mirrors 408, creating a step down from the top surface 502 of etch resistant layer 416 to the top surface 504 of fill layer 418. A step down of 1,000 Å to 1,200 Å is acceptable, and will be filled by the formation of subsequent layers as described below.

Figure 6:
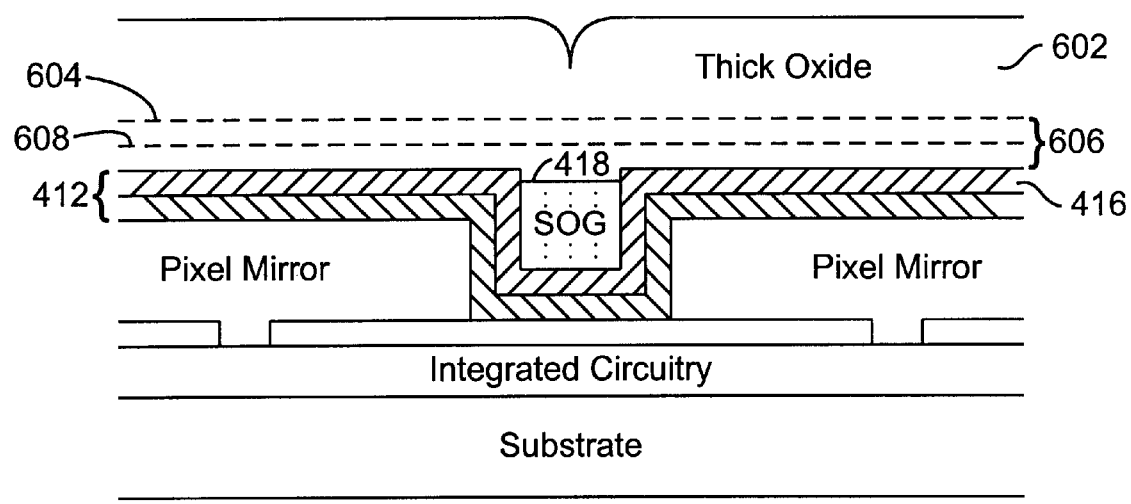
FIG. 6 is a cross-sectional view of the reflective light-valve backplane of FIG. 5, having a thick etchable oxide layer deposited thereon.

FIG. 6 is a cross-sectional view of reflective backplane 400 following the formation of a an etchable layer 602 (e.g., a thick oxide layer). Etchable layer 602 fills in the step down from etch resistant cap layer 416 to fill layer 418, as long as the step down is less than or equal to 1,200 Å. Etchable layer 602 is then formed into a planar layer 606, using a CMP process to reduce its thickness to a first level 604. Because of the limitations associated with known CMP processes, the first thickness of planar layer 606 cannot be less than 1,000 Angstroms. Then, planar layer 606 is etched to further reduce its thickness to a second level 608, which may be less than 1,000 Angstroms. Thus the method of the present invention may be used to produce planar layers having thicknesses on the order of thin optical films (e.g., 700–900 nm).

Figure 7:
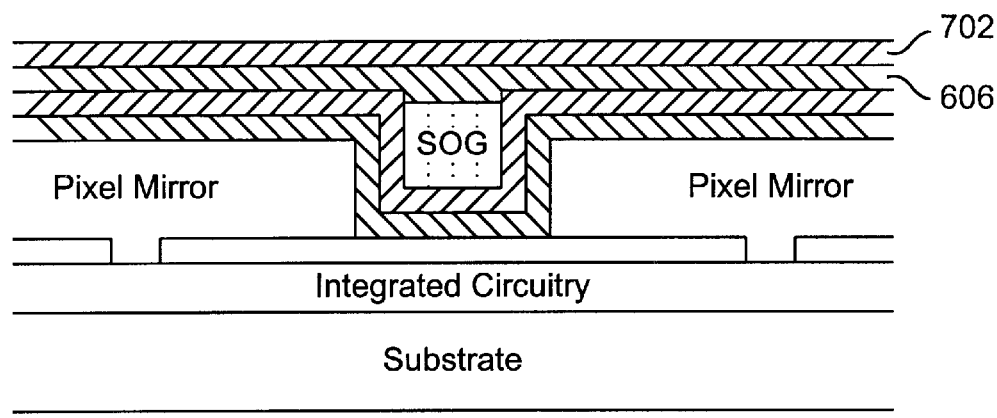
FIG. 7 is a cross-sectional view of the reflective light-valve backplane of FIG. 6, following a CMP step, an etch of the etchable layer, and the deposition of a protective layer.

FIG. 7 is a cross-sectional view of reflective backplane 400 following the deposition of a protective layer 702 on planar layer 606. In a particular embodiment, protective layer 702 is a 1,200 Å nitride layer and the portion of planar layer 606 overlying pixel mirrors 408 has a thickness of 680 Å. Protective layer 702 makes the surface of reflective backplane 400 more robust, so as to be able to withstand further processing in construction of a reflective light valve. For example, in constructing a liquid crystal display a polyimide coating is physically wiped onto the reflective backplane. Without a protective coating, this wiping step would destroy the reflective backplane. Those skilled in the art will recognize that alternative protective coatings (e.g., a doped oxide or a silicon oxy nitride) may be substituted for protective layer 702.

Protective layer 702 also functions as an optical thin film coating. Further, protective layer 702, planar layer 606, and etch-resistant layer 412 may be considered to form a multilayered optical thin film coating. The use of such multilayered coatings typically results in better optical performance over a wider optical spectrum. FIG. 10 is a flow chart summarizing a method of performing the second step (Form Etchable Layer on Substrate) of the method of FIG. 9.

Reflective display backplane 400 is superior to prior art reflective backplanes for a number of reasons. First, the planar surface of reflective backplane 400 eliminates spurious reflections of light off of the lateral edges of pixel mirrors 408. Second, the robust planar surface of reflective backplane 400 facilitates the easy application of subsequently applied display materials, for example, polyimide and/or liquid crystal material. Additionally, reflective backplane 400 can be manufactured entirely by standard silicon manufacturing procedures, and may, therefore, be inexpensively manufactured by existing silicon manufacturing facilities.

Figure 1:
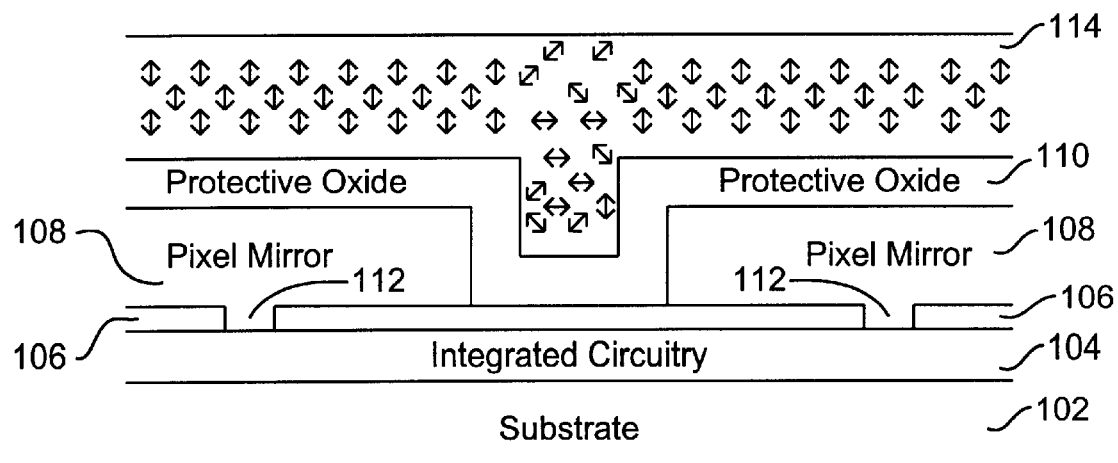
FIG. 1 is a cross-sectional view of a prior art reflective light-valve backplane.
Figure 2:
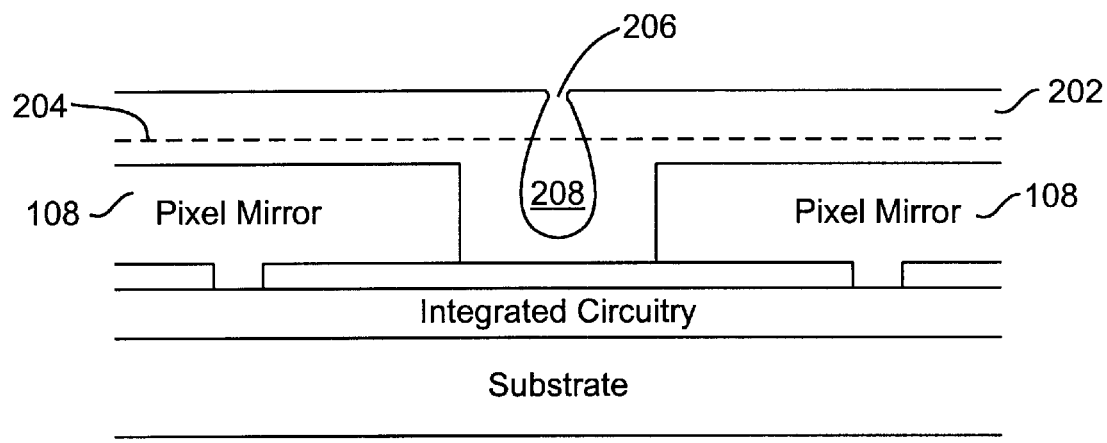
FIG. 2 is a cross-sectional view of a reflective light-valve backplane having a thick protective layer deposited thereon.
Figure 3:
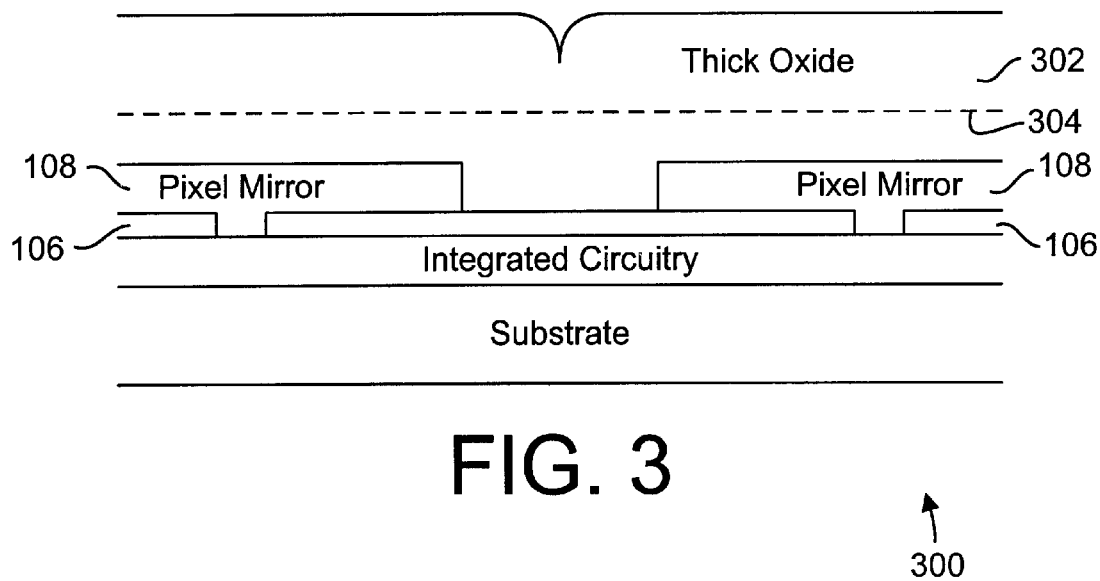
FIG. 3 is a cross sectional view of a reflective light-valve backplane, illustrating a prior art planarization technique.

The particular method of the present invention described with reference to FIGS. 4–7 is particularly well suited for planarizing substrates having surface projections in excess of 1,000 Angstroms (e.g., thick pixel mirrors). For substrates having surface projections smaller than 1,000 Angstroms, no "key-hole effect" (FIG. 2) occurs. Therefore, the steps of forming etch-resistant layer 412 and fill layer 418 may be omitted, and etchable layer 302 may be formed directly over pixel mirrors 408 and the portions of support layer 406 exposed by the gaps between pixel mirrors 408.

Figure 8:
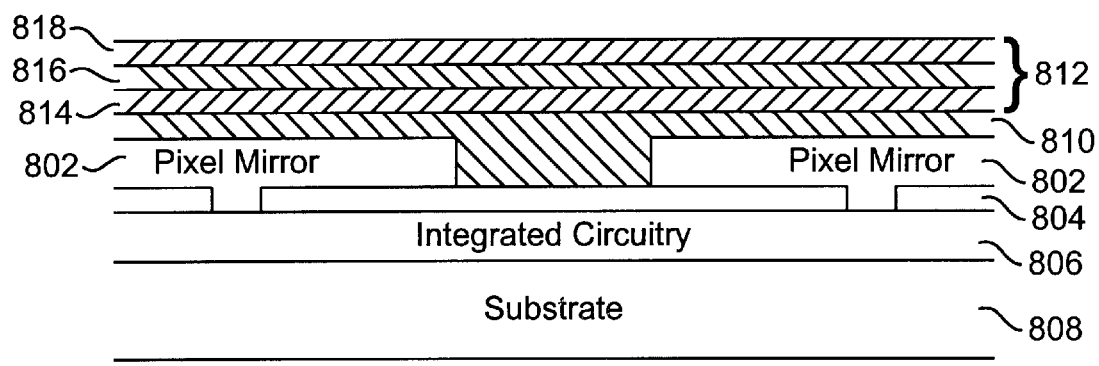
FIG. 8 is a flow chart summarizing a method of planarizing the surface of a device, according to the present invention.

FIG. 8 is a cross-sectional view of a planarized reflective backplane 800, formed without a fill layer. Reflective backplane 800 includes a plurality of pixel mirrors 802, an insulating support layer 804, and an integrated circuitry layer 806, all formed on a silicon substrate 808. A planar layer 810 is formed on pixel mirrors 802 and exposed portions of support layer 804, using the combined CMP-etch method described above. In a particular embodiment, planar layer 810 is an oxide layer having a thickness in the range of 750 Å (±10%) over pixel mirrors 802, and functions as an optical thin film.

A protective layer 812 is formed on planar layer 810 to provide added strength and durability. In a particular embodiment, protective layer 812 includes a first nitride layer 814 (640 Å (±10%)), an oxide layer 816 (840 Å (±10%)), and a second nitride layer 818 (1,200 Å (±10%)). Planar layer 810 and protective layer 812, together, form a multilayered optical thin film coating.

Figure 9:
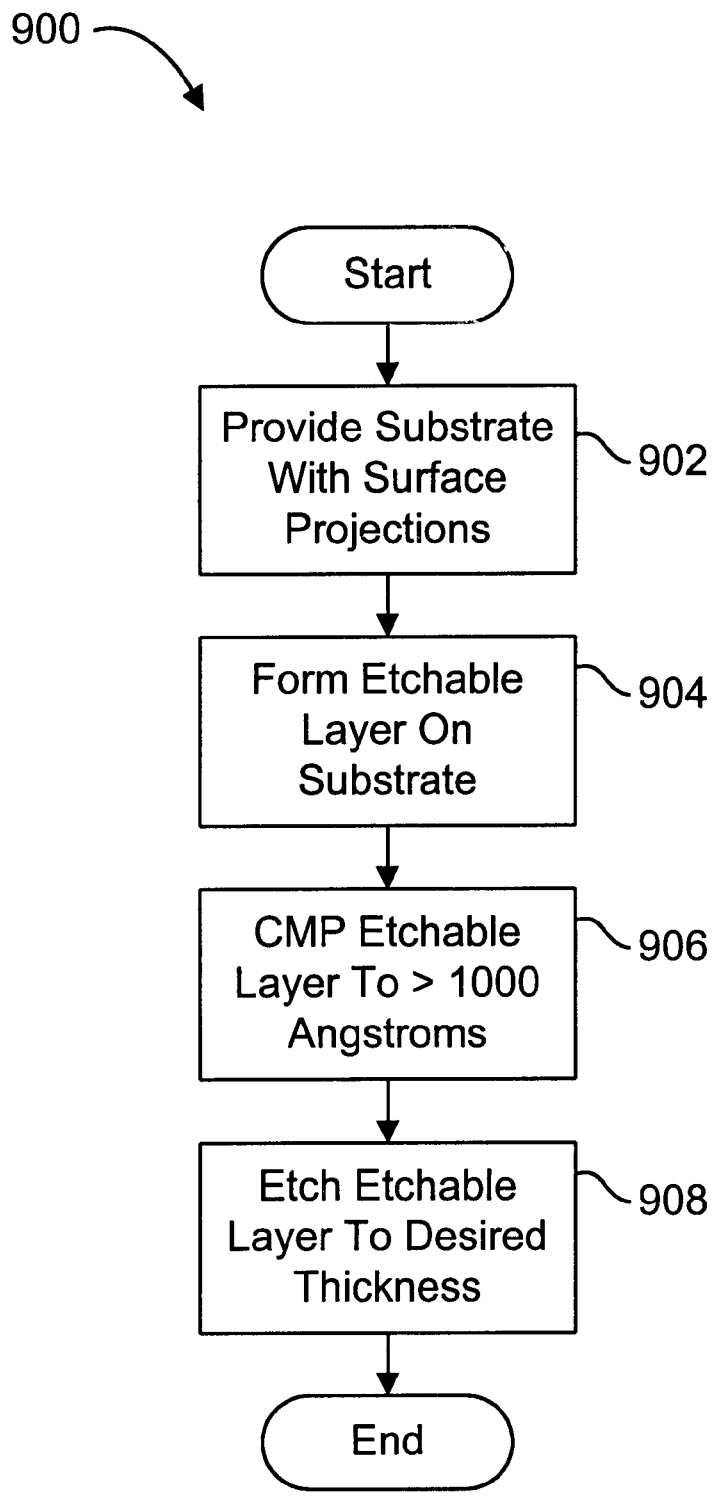
FIG. 9 is a flow chart summarizing a method of performing the step of forming a thick oxide layer shown FIG. 8.
Figure 10:
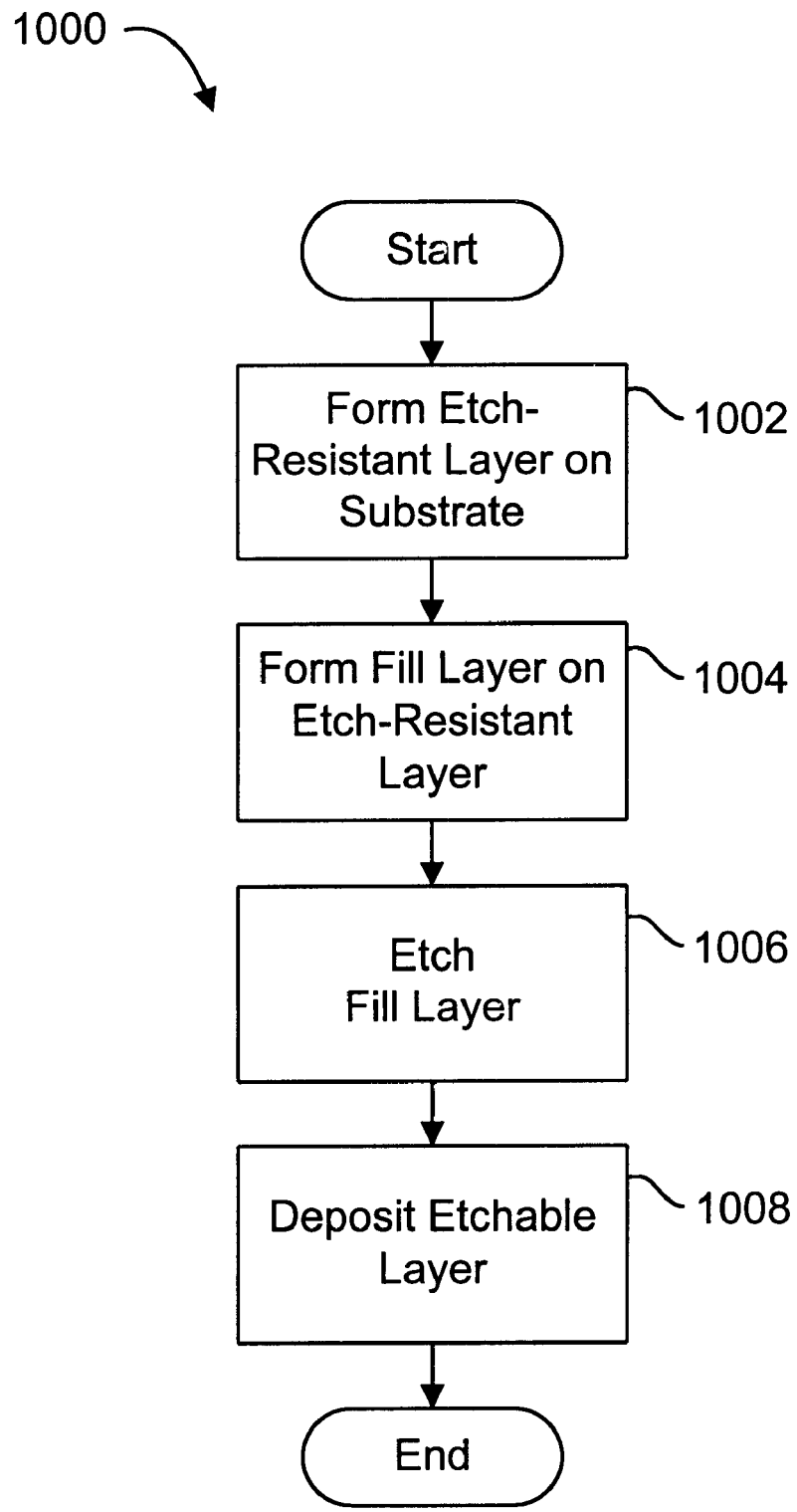
FIG. 10 is a flow chart summarizing a method of performing the second step (Form Etchable Layer on Substrate) of the method of FIG. 9.

FIG. 9 is a flow chart summarizing a method 900 of forming a planarized reflective backplane according to the present invention. Method 900 includes a first step 902 of providing a substrate with surface projections. In a particular method, the substrate is a reflective display backplane and the projections are pixel mirrors, but those skilled in the art will recognize that the method of the present invention may be utilized to planarize other substrates, for example other integrated circuits having optical elements disposed on their surfaces.

Next, in a second step 904, an etchable layer is formed on the substrate including the surface projections and the gaps defined therebetween. Those skilled in the art will recognize that the formation of the etchable layer in second step 704 may include a number of substeps. For example, as described above with reference to FIG. 6, the etchable layer 602 may be formed over an etch-resistant layer 412 and a fill layer 418. Optionally, as described above with reference to FIG. 8 the etchable layer (planar layer 810) may be formed directly on pixel mirrors 802 and exposed portions of support layer 804.

Next, in a third step 906, a CMP process is performed on etchable layer 602, to form a planar layer 606 having a first thickness (>1,000 Angstroms). Then, in a fourth step 908, planar layer 606 is etched down to a desired second thickness (<1,000 Angstroms). In an optional step (not shown in FIG. 9), a protective layer 702 is formed over the etched planar layer 606. The protective layer serves as both a passivization layer and physical protection layer. In a particular method the protective layer includes multiple sublayers, and the step of forming the protective layer includes the substeps of forming each of the respective sublayers. For example, as explained with reference to FIG. 8, protective layer 812 is formed by forming a first nitride layer 814 on etched planar layer 810, then forming an oxide layer 816 on nitride layer 814, and, finally, forming a second nitride layer 818 on oxide layer 816.

FIG. 10 is a flow chart summarizing a particular method 1000 of performing second step 904 (Form Etchable Layer on Substrate) of method 900 of FIG. 9. Method 1000 is particularly well suited for forming an etchable layer over surface projections in excess of 1,000 Angstroms. In a first step 1002, an etch-resistant layer 412 (FIG. 4) is formed over pixel mirrors 408 and exposed portions of support layer 406. Then, in a second step 1002, a fill layer 418 (e.g., spin-on-glass) is formed on etch-resistant layer 412. Next, in a third step 1006, fill layer 418 is etched to expose portions of etch-resistant layer 412 overlying pixel mirrors 408, but leaving a portion of fill layer 418 in the gaps between pixel mirrors 408 (FIG. 5). Finally, in a fourth step 1008, etchable layer 602 is formed on the exposed portions of etch resistant layer 412 and the remaining portions of fill layer 418 (FIG. 6).

The description of particular embodiments of the present invention is now complete. Many of the described features may be substituted, altered or omitted without departing from the scope of the invention. For example, a fill layer may be formed by means other than applying a spin-on coating. Additionally, it is contemplated that materials of suitable durability may be used in forming the planar layer, such that the additional formation of the protective layer may be omitted. Further, the use of the present invention is not limited to planarizing reflective display backplanes. Rather, the invention may be employed wherever it is desirable to planarize a substrate having a plurality of surface projections with thin film layers formed over the projections.

We claim:

1. A method for forming a thin planar layer on the surface of a device, said method comprising the steps of:

providing a substrate including a plurality of surface projections defining gaps therebetween;

forming an etchable layer on said substrate;

performing a CMP process on said etchable layer to form a first planar layer having a first thickness; and etching said first planar layer, by an etching process other than CMP, to a second thickness to form the thin planar layer.

2. A method according to claim 1, wherein:

said substrate comprises an integrated circuit; and said projections comprise optical elements.

3. A method according to claim 1, wherein:

said substrate comprises a reflective display backplane; and said projections comprise pixel mirrors.

4. A method according to claim 1, wherein:

said first thickness is greater than or equal to 1000 angstroms; and said second thickness is less than 1000 angstroms.

5. A method according to claim 1, wherein said step of forming said etchable layer on said substrate comprises the steps of:

forming an etch resistant layer on said substrate;

forming a fill layer on said etch-resistant layer;

etching said fill layer to expose portions of said etch-resistant layer overlying said projections, and to leave a portion of said fill layer in said gaps; and forming said etchable layer on said exposed portions of said etch-resistant layer and said fill layer.

6. A method according to claim 5, wherein said step of forming said etch-resistant layer comprises a step of depositing an optical thin film layer.

7. A method according to claim 6, wherein said step of forming said etch-resistant layer further comprises a step of depositing an etch-resistant cap layer over said optical thin film layer.

8. A method according to claim 7, wherein said etch-resistant cap layer comprises a nitride layer.

9. A method according to claim 7, wherein said etch resistant cap layer has a thickness in the range of 640 Å (±10%).

10. A method according to claim 6, wherein said optical thin film layer comprises an oxide layer.

11. A method according to claim 10, wherein said oxide layer has a thickness in the range of 750 Å (±10%).

12. A method according to claim 10, wherein said etch-resistant layer further comprises an etch-resistant cap layer.

13. A method according to claim 12, wherein said etch-resistant cap layer comprises a nitride layer.

14. A method according to claim 13, wherein:

said oxide layer has a thickness in the range of 750 Å (±10%); and said nitride layer has a thickness in the range of 640 Å (±10%).

15. A method according to claim 6, wherein said optical thin film layer has a thickness in the range of 750 Å (±10%).

16. A method according to claim 5, further comprising the step of forming a protective layer on said thin planar layer, following said step of etching said first planar layer.

17. A method according to claim 16, wherein said step of forming said protective layer comprises a step of forming a nitride layer on said thin planar layer.

18. A method according to claim 17, wherein said nitride layer has a thickness in the range of 1,200 Å (±10%).

19. A method according to claim 5, wherein said thin planar layer comprises an oxide layer.

20. A method according to claim 19, wherein said oxide layer has a thickness in the range of 840 Å (±10%).

21. A method according to claim 19, further comprising a step of forming a nitride layer on said oxide layer.

22. A method according to claim 21, wherein:

said oxide layer has a thickness in the range of 840 Å (±10%); and said nitride layer has a thickness in the range of 1,200 Å (±10%).

23. A method according to claim 5, wherein said step of forming said fill layer comprises a step of applying a spin-on-coating over said etch-resistant layer.

24. A method according to claim 23, wherein said fill layer comprises spin-on-glass.

25. A method according to claim 23, wherein said fill layer comprises a light absorbing dopant.

26. A method according to claim 25, wherein said dopant comprises dye.

27. A method according to claim 5, wherein said step of etching said fill layer comprises etching said fill layer for a time sufficient to create a step-down, from said etch-resistant layer overlying said pixel mirrors to said fill layer remaining in said gaps, of less than or equal to 1,200 Å (±10%).

28. A method according to claim 1, wherein said planar layer of said second thickness comprises an optical thin film layer.

29. A method according to claim 28, wherein said optical thin film layer has a thickness in the range of 840 Å (±10%).

30. A method according to claim 28, wherein said optical thin film layer comprises an oxide layer.

31. A method according to claim 28, further comprising the step of forming a protective layer on said optical thin film layer.

32. A method according to claim 31, wherein said protective layer comprises a nitride layer.

33. A method according to claim 31, wherein said protective layer has a thickness in the range of 1,200 Å (±10%).

34. A method according to claim 31, wherein said step of forming said protective layer comprises the steps of:

forming a first nitride layer on said optical thin film layer;

forming an oxide layer on said first nitride layer; and forming a second nitride layer on said oxide layer.

35. A method according to claim 34, wherein:

said optical thin film layer comprises an oxide layer having a thickness in the range of 750 Å (±10%);

said first nitride layer has a thickness in the range of 640 Å (±10%);

said oxide layer on said first nitride layer has a thickness in the range of 840 Å (±10%); and said second nitride layer has a thickness in the range of 1,200 Å (±10%).

\* \* \* \* \*